(12) United States Patent
Satori et al.

(10) Patent No.: US 7,530,005 B2
(45) Date of Patent: May 5, 2009

(54) STORAGE DEVICE

(75) Inventors: Kenichi Satori, Tokyo (JP); Kenichi Nakanishi, Tokyo (JP); Hideaki Bando, Tokyo (JP); Takahiro Fukushige, Tokyo (JP)

(73) Assignee: Sony Corporation, Tokyo (JP)

( * ) Notice: Subject to any disclaimer, the term of this patent is extended or adjusted under 35 U.S.C. 154(b) by 637 days.

(21) Appl. No.: 11/222,128

(22) Filed: Sep. 8, 2005

(65) Prior Publication Data

US 2006/0077583 A1    Apr. 13, 2006

(30) Foreign Application Priority Data

Sep. 22, 2004    (JP)    ............................ P2004-275596

(51) Int. Cl.
  *G11C 29/00*    (2006.01)
(52) U.S. Cl. .................. 714/763; 714/782; 714/784
(58) Field of Classification Search .................. 714/769, 714/784, 782; 369/47.27
  See application file for complete search history.

(56) References Cited

U.S. PATENT DOCUMENTS 4,596,014 A * 6/1986 Holeman .................... 714/805
7,272,773 B2 * 9/2007 Cargnoni et al. ............ 714/763

* cited by examiner

*Primary Examiner*—Guy J Lamarre
(74) *Attorney, Agent, or Firm*—Robert J. Depke; Rockey, Depke & Lyons, LLC.

(57) ABSTRACT

The present invention has been made to realize a storage device capable of normally reading out data from the erase processing applied area. In a semiconductor storage device 1, when data read processing is performed for the erase-processing applied area in a memory section 2 to read out erase-state actual data Ddr and erase-state parity data Ddp each containing only "1s", the erase-state actual data Ddr and erase-state parity data Ddp are inverted by a third data inverting circuit 13 to make all the values thereof "0", followed by execution of the error detection processing. With the above configuration, it is possible to prevent an error from being detected in the error detection processing.

14 Claims, 8 Drawing Sheets

VPP: POSITIVE HIGH VOLTAGE FOR WRITING DATA ON WORD LINE
VPASS: POSITIVE VOLTAGE FOR PASSING WRITE DATA ON WORD LINE

STORAGE DEVICE

CROSS REFERENCE TO RELATED APPLICATIONS

The present invention contains subject matter related to Japanese Patent Application JP 2004-275596 filed in the Japanese Patent Office on Sep. 22, 2004, the entire contents of which being incorporated herein by reference.

BACKGROUND OF THE INVENTION

1. Field of the Invention

The present invention relates to a storage device and is suitably applied to a semiconductor storage device configured to receive data transmitted from an information processing device such as a personal computer and store the data in an internal semiconductor memory (flash memory, etc.).

2. Description of the Related Art

As a semiconductor storage device of such a type, card type semiconductor storage devices have become popular in recent years. Among them, a memory stick® and the like are widely known.

When such a semiconductor storage device receives data (hereinafter, referred to as "actual data", for the sake of convenience) to be stored in an internal flash memory from an information processing device corresponding to a personal computer, it firstly generates parity data for error detection/correction processing corresponding to the received actual data. Then the actual data and generated parity data are associated with each other and stored in the flash memory.

When reading out the actual data stored in the internal flash memory, the semiconductor storage device reads out the parity data corresponding to the actual data together with the actual data and performs error detection/correction processing for the actual data based on the read out parity data. In the error detection/correction processing, the semiconductor storage device detects whether there occurs an error in the actual data based on the read out parity data. When detecting that there occurs no error in the actual data, the semiconductor storage device outputs the actual data to an external device without change. On the other hand, when detecting that there occurs any error in the actual data, it corrects the error of the actual data based on the parity data and outputs the corrected actual data to an external device.

As described above, the semiconductor storage device is configured to ensure accuracy of the actual data stored in the flash memory (refer to, for example, Jpn. Pat. Appln. Laid-Open Publication No. 2004-164634).

SUMMARY OF THE INVENTION

In a NAND-type flash memory of the semiconductor storage device, data erase processing is executed for each specified area (for example, for each one block (=128 [Kbyte])), in general.

Figure 7:
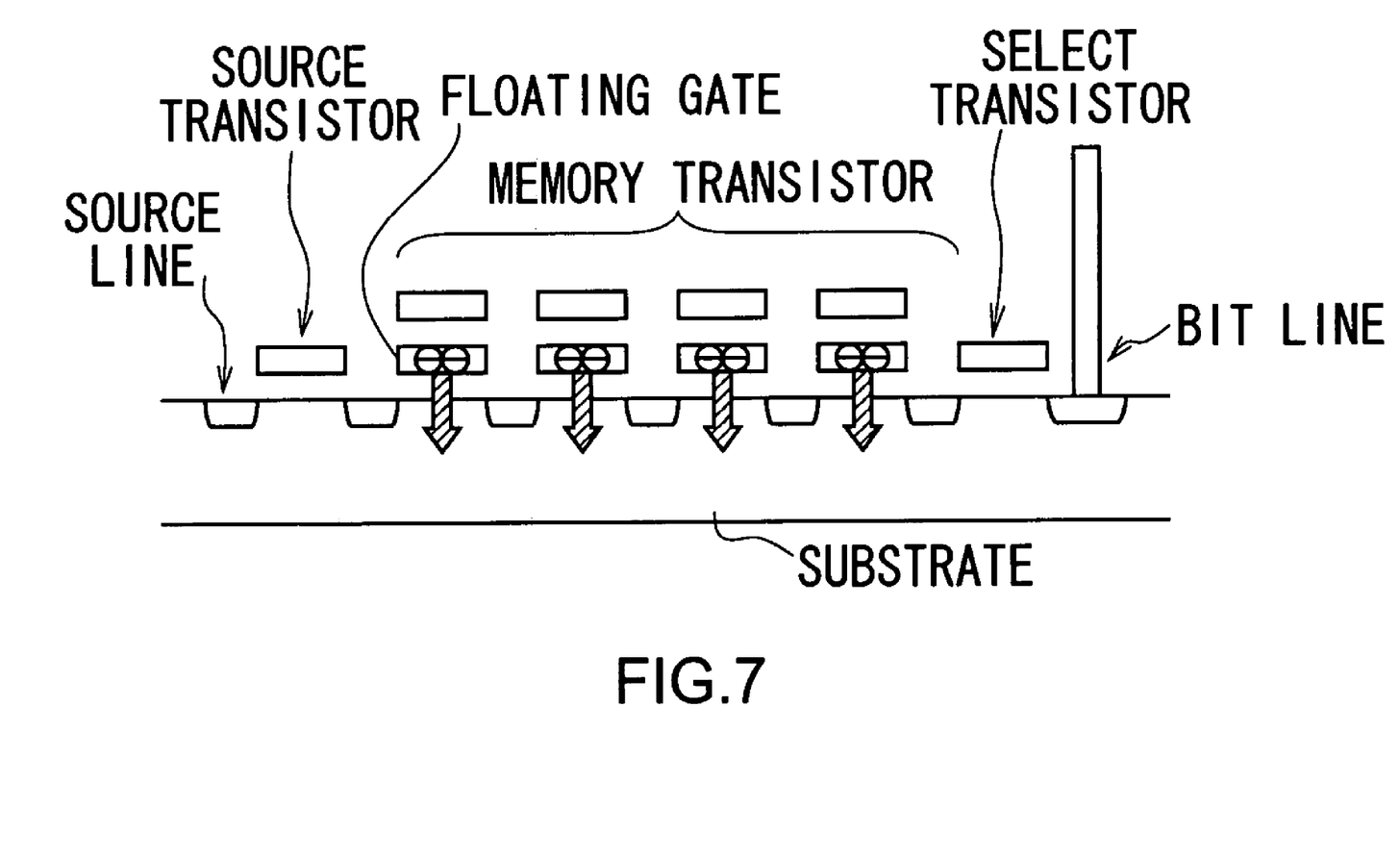
FIG. 7 is a schematic view for explaining data erase processing in the NAND-type flash memory.
Figure 8A:
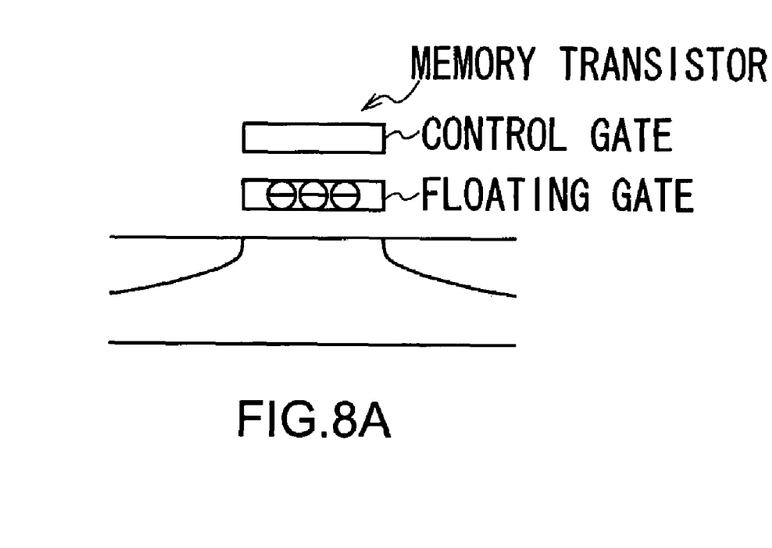
FIGS. 8A and 8B are schematic views for explaining a data storage state in a memory transistor.
Figure 8B:
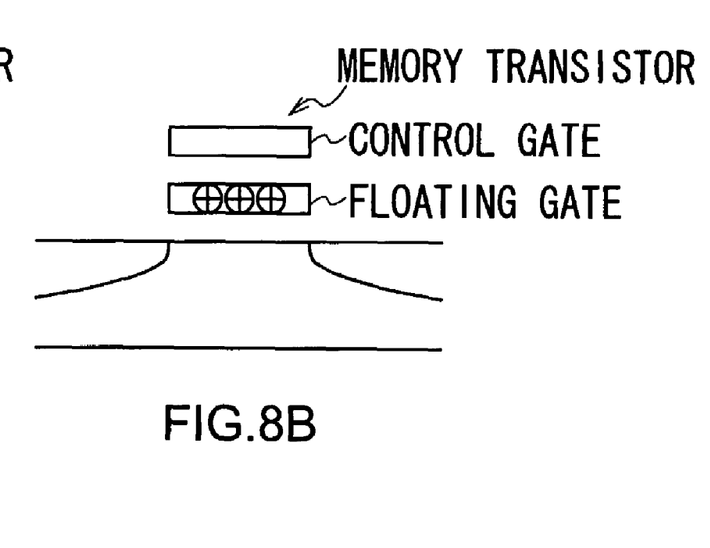

In the data erase processing, as shown in FIG. 7, an application of a positive high voltage to the substrate of the target area for the data erase processing draws electrons from floating gates of a memory transistor existing in this area. As a result, all the memory transistors existing in the area (hereinafter, referred to appropriately as "erase processing applied area") to which the data erase processing has been applied transits from a write state representing data "0" (FIG. 8A) to an erase state representing "1" (FIG. 8B).

In the semiconductor storage device having the above flash memory, data readout processing is performed for the erase processing applied area in some cases, for example, for the check of data storage state in the flash memory.

In such a case, the semiconductor storage device reads out data (hereinafter referred to appropriately as "erase-state actual data") representing an erase state from the portion storing the actual data in the erase processing applied area and, at the same time, correspondingly reads out data representing an erase state (hereinafter referred to appropriately as "erase-state parity data") representing an erase state from the portion storing the parity data in the erase processing applied area. After that, the semiconductor storage device executes error detection/correction processing for the read out erase-state actual data based on the read out erase-state parity data.

In the semiconductor storage device of such a type, a BCH coding or Read Solomon coding is adopted. In such an error detection/correction system, all values of the parity data generated based on the data containing only 0s become "0"; whereas all values of the parity data generated based on the data containing only 1s do not become "1".

Therefore, in the semiconductor storage device adopting such an error detection/correction processing system, when the error detection/correction processing is executed for the erase-state actual data (all values are "1") based on the corresponding erase-state parity data (all values are "1") read out from the erase processing applied area, it is determined that an error exists in the erase-state actual data, with the result that the unnecessary error correction processing is executed for the erase-state actual data.

As a result, in a conventional semiconductor device, although all values of the data stored in the erase processing applied area are "1" and, therefore, the data is correct, it is impossible to read out the data as correct data.

The present invention has been made in view of the above point, and an object thereof is to propose a storage device capable of normally reading out data from the erase processing applied area.

To solve the above problem, according to an aspect of the present invention, there is provided a storage device having a storage means for storing data and error detection data for detecting an error in the data, and an error detection means for performing error detection processing for detecting whether there is an error in readout data based on the error detection data corresponding to the data read out from the storage means, the device being provided with a first data inverting means for inverting the data read out from the storage means and the error detection data corresponding to the data and allowing the error detection means to perform the error detection processing after the data inversion.

As a result, in the storage device, when data read processing is performed for the erase-processing applied area in the storage means to read out data (erase-state actual data) and error detection data (erase-state parity data) each containing only "1s", the data and error detection data are inverted by the first data inverting means to make all the values thereof "0", followed by execution of the error detection processing. With the above configuration, it is possible to prevent an error from being detected in the error detection processing.

The storage device according to the present invention further includes a second data inverting means for inverting the data that has been subjected to the error detection processing by the error detection means and then outputting the inverted data.

As a result, in the storage device, the data (inverted erase-state actual data) whose all values become "0" after being subjected to the error detection processing can be output after all the values thereof are made "1" by the data inversion performed by the second data inverting means. Thus, it is possible to allow the processing side that processes the output data to reliably recognize that the output data is the one that has been read out from the erase processing applied area.

The storage device according to the present invention further includes an error detection data generation means for generating the error detection data corresponding to the data to be stored in the storage means, and further includes: a third data inverting means for inverting the data to be stored in the storage means and allowing the error detection data generation means to generate the error detection data corresponding to the data after the data inversion; and a fourth data inverting means for inverting the data inverted by the third data inverting means and the error detection data which is generated so as to correspond to the data and allowing the storage means to store them after the data inversion.

As a result, in the storage device, in the case where the data (erase-state actual data) containing only "1s" is once read out from the erase processing applied area of the storage means and stored, without change, in the storage means again, error detection data (parity data) corresponding to the data is generated after the data is inverted to make all values thereof "0" to thereby make all values of the error detection data "0". Further, the data whose all values become "0" by the data inversion and the error detection data corresponding to the data and containing only "0s" are inverted to make all values thereof "1" and then stored in the storage means. With this configuration, it is possible to allow the storage means to keep holding "1" representing a state where the data has been erased.

As a result, in the storage device according to the present invention, when data read processing is performed for the erase-processing applied area in the storage means to read out data (erase-state actual data) and error detection data (erase-state parity data) each containing only "1s", the data and error detection data are inverted by the first data inverting means to make all the values thereof "0", followed by execution of the error detection processing. With the above configuration, it is possible to prevent an error from being detected in the error detection processing. As a result, it is possible to realize a storage device capable of normally reading out data from the erase processing applied area.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

An embodiment of the present invention will be described in detail with reference to the accompanying drawings.

(1) Configuration of Semiconductor Storage Device

Figure 1:
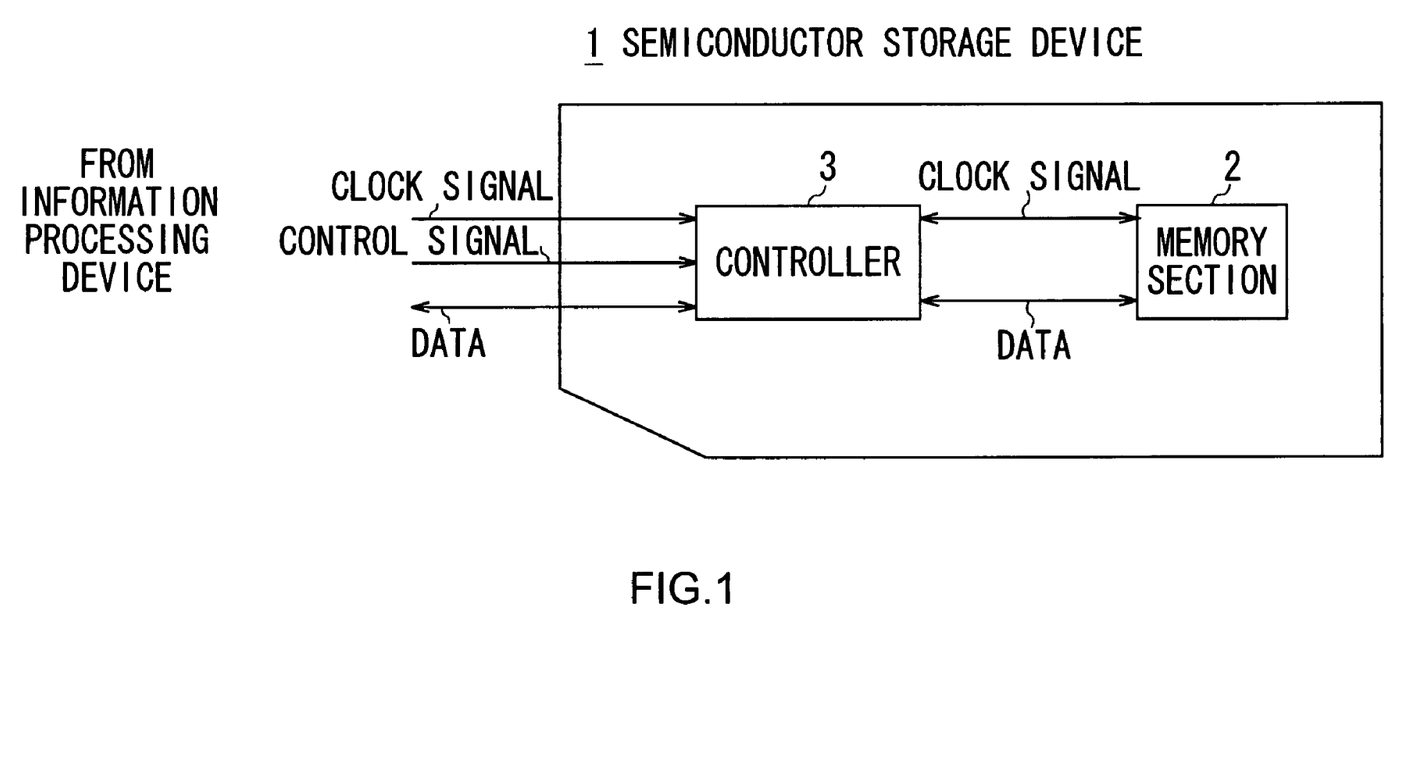
FIG. 1 is a schematic view showing a configuration of a semiconductor storage device according to an embodiment of the present invention.

In FIG. 1, reference numeral 1 represents, as a whole, a card type semiconductor storage device. The semiconductor storage device 1 includes a memory section 2 corresponding to, for example, a NAND-type flash memory, a controller 3 that controls data write processing and data read processing of the memory section 2.

The controller 3 allows the memory section 2 to perform data write processing for storing actual data supplied from an information processing device based on a control signal supplied from the information processing device, as well as allows the memory section 2 to perform data read processing for reading out the stored actual data based on a control signal supplied from the information processing device.

A configuration of the controller 3 will be described with reference to FIG. 2. In the controller 3, under the control of an MCU (Micro Controller Unit) 4 that controls the entire controller 3, a host interface section 5 loads the actual data supplied from the information processing device based on a clock signal from the information processing device and supplies the actual data to a page buffer section 6.

Under the control of the MCU 4, the page buffer section 6 temporarily stores the actual data input from the information processing device through the host interface section 5 and appropriately supplies the stored actual data to an encoder circuit 7A of an ECC (Error Correcting Circuit) section 7.

Figure 3:
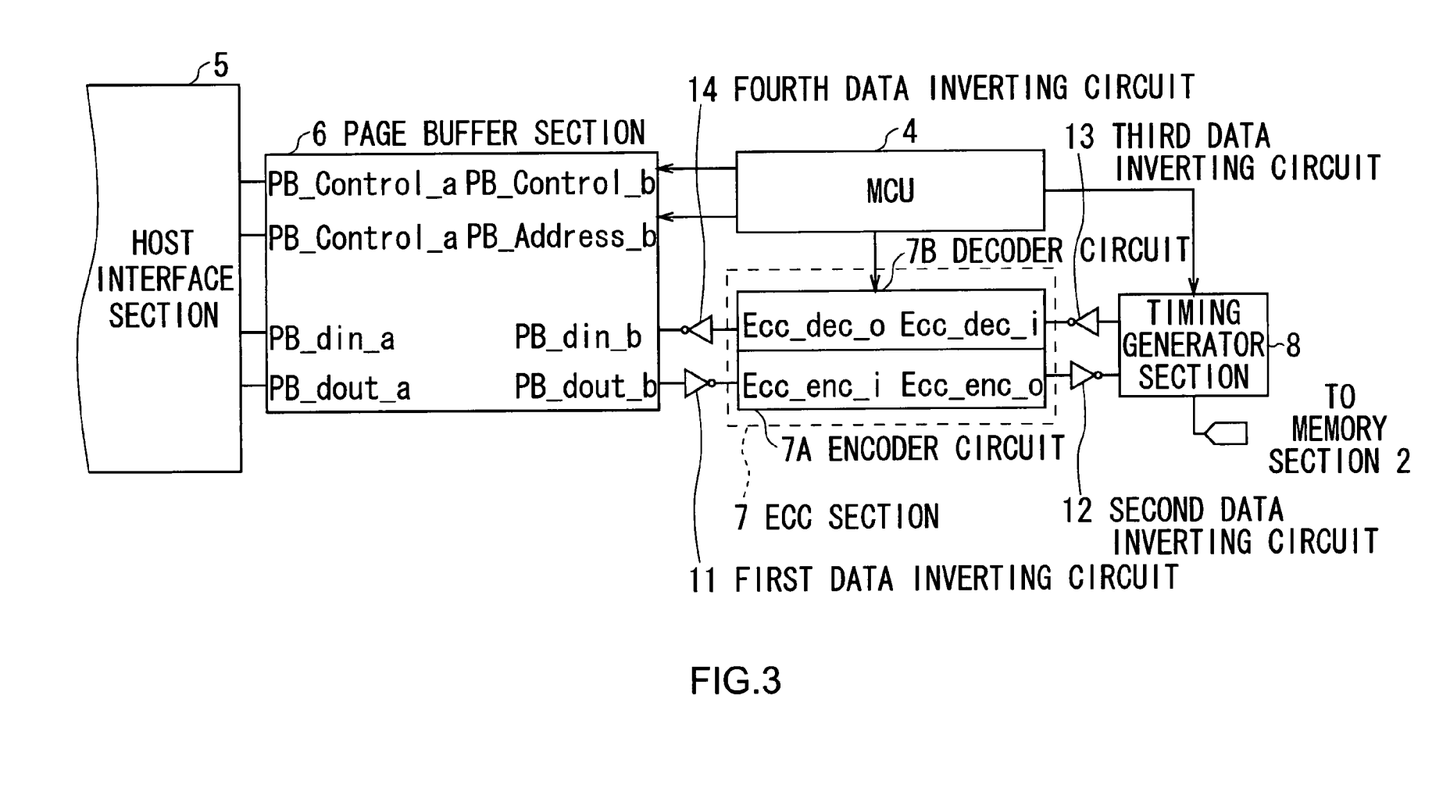
FIG. 3 is a schematic view showing a detailed configuration of the controller.

In practice, in the case of the embodiment of the present invention, a first data inverting circuit 11 is provided between the page buffer section 6 and encoder circuit 7A of the ECC section 7, as shown in detail in FIG. 3. The first data inverting circuit 11 performs bit inversion for inverting respective bits in the actual data supplied from the page buffer section 6. The first data inverting circuit 11 supplies the inverted actual data obtained by bit-inverting the actual data from the page buffer section 6 to the encoder circuit 7A of the ECC section 7.

At this time, the encoder circuit 7A of the ECC section 7 generates parity data corresponding to the supplied inverted actual data based on, for example, a BCH coding. The encoder circuit 7A of the ECC section 7 then supplies the inverted actual data and parity data corresponding to the inverted actual data to a timing generator section 8.

In practice, in the case of the embodiment of the present invention, a second data inverting circuit 12 is provided between the encoder circuit 7A of the ECC section 7 and timing generator section 8, as shown in detail in FIG. 3. The second data inverting circuit 12 performs bit inversion for inverting respective bits in the inverted actual data and parity data supplied from the encoder circuit 7A. The second data inverting circuit 12 supplies the original actual data obtained by bit-inverting the inverted actual data and inverted parity data obtained by bit-inverting the parity data to the timing generator section 8.

Under the control of the MCU 4, the timing generator section 8 supplies the actual data and inverted parity data corresponding to the actual data supplied from the encoder circuit 7A of the ECC section 7 through the second data inverting circuit 12 to the memory section 2. At the same time, the timing generator section 8 supplies a write control signal for instructing the memory 2 to store the actual data and inverted parity data.

As a result, the memory section 2 performs data write processing for storing the actual data and inverted parity data corresponding to the actual data supplied from the timing generator section 8 based on the write control signal supplied from the timing generator section 8. In this manner, the actual data supplied from the information processing device side and corresponding inverted parity data generated by the encoder circuit 7A are written in the memory section 2 of the semiconductor storage device 1.

Figure 4:
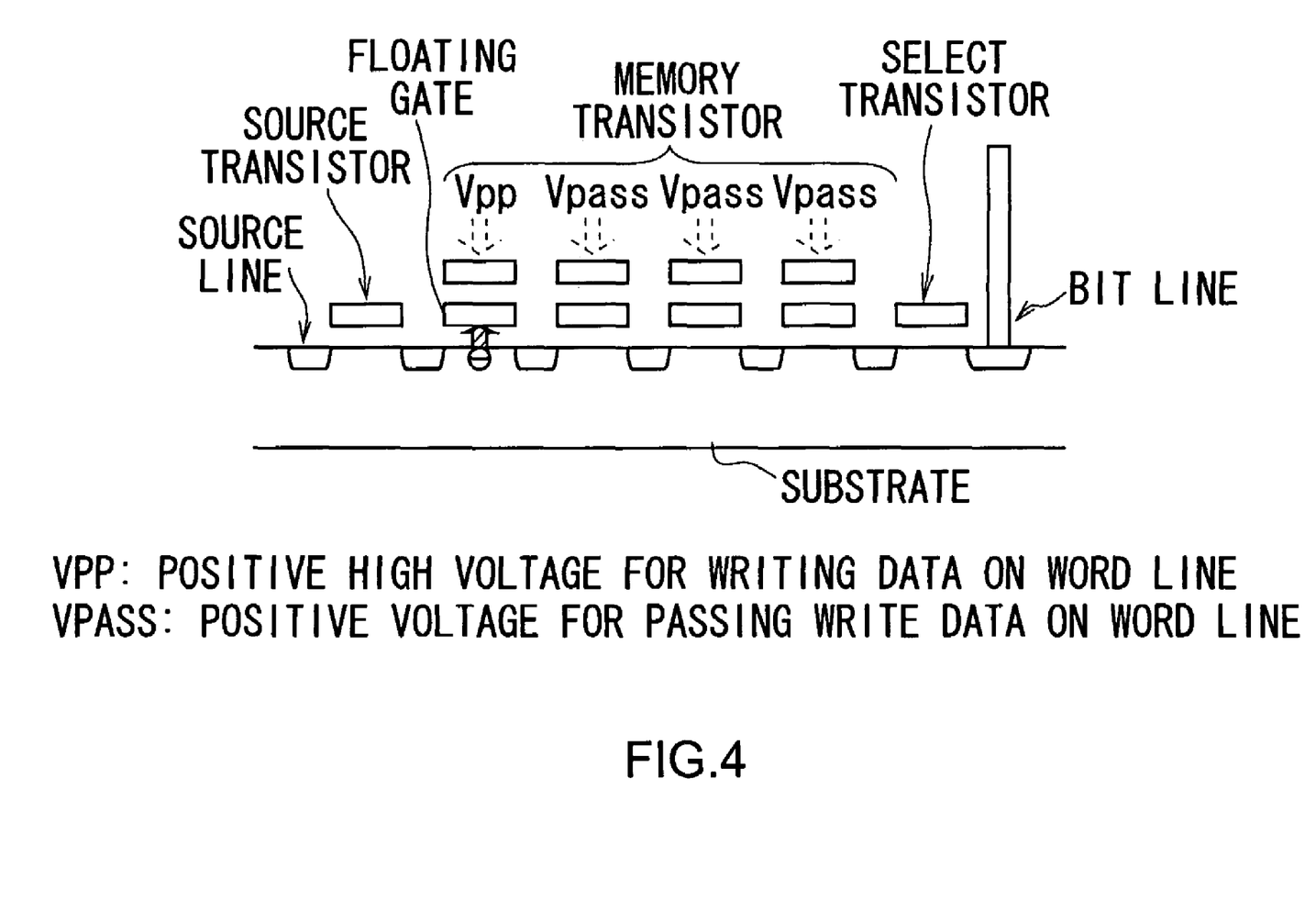
FIG. 4 is a schematic view for explaining data write processing in a NAND-type flash memory.

Incidentally, in the memory section 2, the data write processing is performed as follows. That is, in the data write processing, when a bit with a value of "0" exists in the actual data and inverted parity data supplied from the timing generator section 8, an electron is injected to the floating gate of the transistor corresponding to the bit, as shown in FIG. 4. The memory section 2 is configured to set the electrical potential of the corresponding bit line to 0 [V] and set the electrical potential of the corresponding word line to, for example, a positive high voltage in order to inject electron to the floating gate of the memory transistor.

Figure 2:
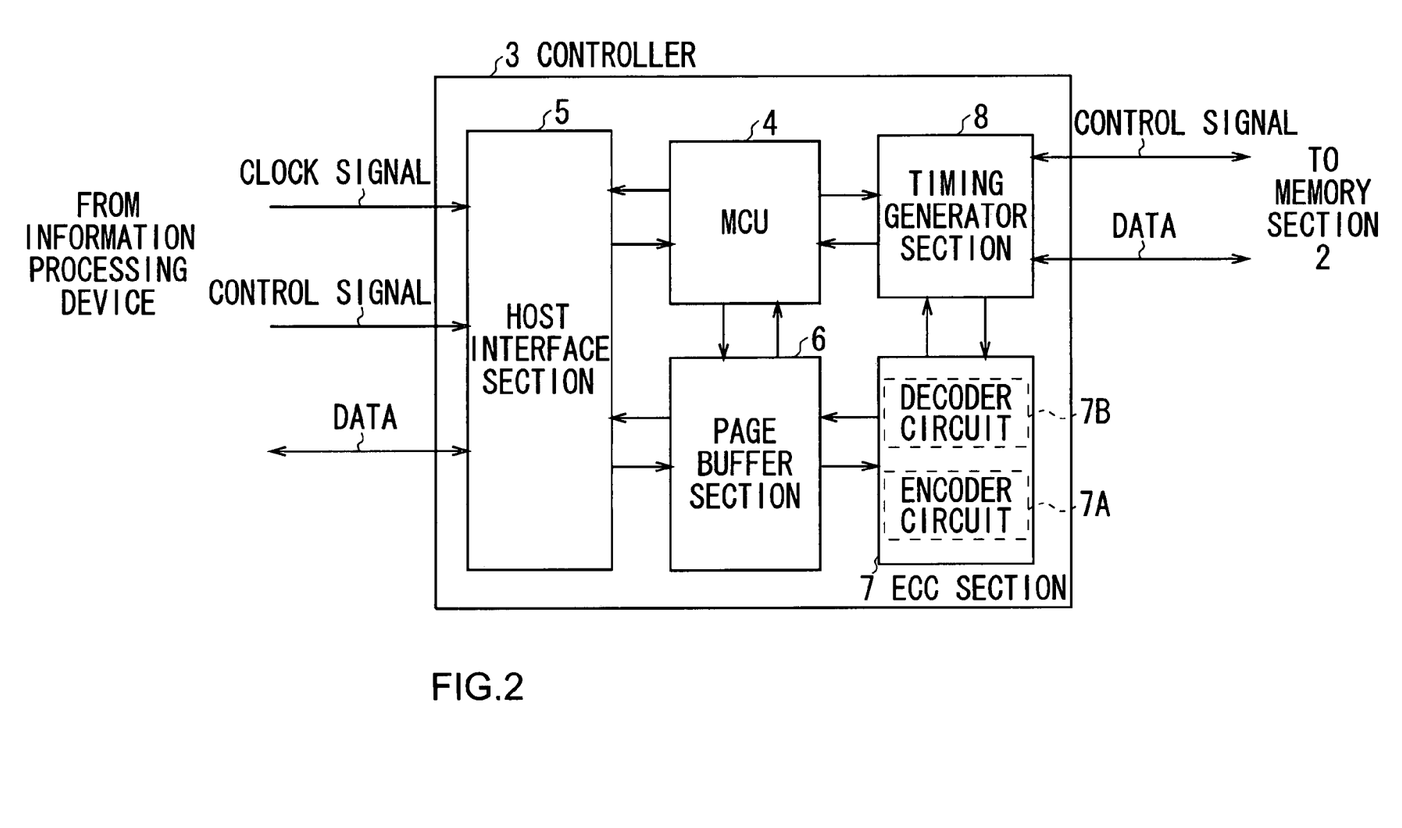
FIG. 2 is a schematic view showing a configuration of a controller.

When the information processing device issues a control signal to instruct the MCU 4 shown in FIG. 2 to read out the actual data stored in the memory section 2 through the host interface section 5, the MCU 4 supplies, through the timing generator section 8, a read control signal for instructing the memory section 2 to read out the actual data.

Based on the supplied read control signal, the memory section 2 performs data read processing to read out the actual data and inverted parity data corresponding to the actual data. Then, the memory section 2 supplies the actual data and inverted parity data read out by the data read processing, to the decoder circuit 7B of the ECC section 7 through the timing generator section 8.

In practice, in the case of the embodiment of the present invention, a third data inverting circuit 13 is provided between the timing generator section 8 and a decoder circuit 7B of the ECC section 7, as shown in detail in FIG. 3. The third data inverting circuit 13 performs bit inversion for inverting respective bits in the actual data and inverted parity data supplied from the memory section 2 through the timing generator section 8. The third data inverting circuit 13 supplies the inverted actual data obtained by bit-inverting the actual data and original parity data obtained by bit-inverting the inverted parity data, to the decoder circuit 7B of the ECC section 7.

The decoder circuit 7B of the ECC section 7 then performs error detection/correction processing for the inverted actual data based on the parity data supplied from the third data inverting circuit 13. In this embodiment, the error detection/correction processing is performed according to the BCH coding as described above.

When no error has been detected in the error detection processing for the inverted actual data, which means that there is no error in the actual data that has been read out from the memory section 2, the decoder circuit 7B outputs the inverted actual data without performing error correction processing for the inverted actual data based on the parity data.

On the other hand, when an error is detected in the error detection processing for the inverted actual data, which means that an error exists in the actual data that has been read out from the memory section 2, the decoder circuit 7B applies the error correction processing to the inverted actual data based on the parity data and outputs the corrected inverted actual data.

In the case of the embodiment, the inverted actual data output from the decoder circuit 7B of the ECC section 7 is supplied to a fourth data inverting circuit 14 provided between the decoder circuit 7B of the ECC section 7 and page buffer section 6 as shown in detail in FIG. 3. The fourth data inverting circuit 14 performs bit inversion for inverting respective bits in the supplied inverted actual data. The fourth data inverting circuit 14 supplies the original actual data obtained by bit-inverting the inverted actual data to the information processing device through the page buffer section 6 and host interface section 5. As a result, the information processing device can acquire the actual data that it has requested from the semiconductor storage device 1.

(2) Data Read Processing and Data Write Processing for Erase Processing Applied Area When the information processing device issues a control signal to instruct the MCU 4 shown in FIG. 2 to make the memory section 2 perform data erase processing through the host interface section 5, the MCU 4 accordingly issues a data erase control signal to instruct the memory section 2 to perform the data erase processing through the timing generator section 8.

At this time, the memory section 2 performs the data erase processing for the area (for example, area corresponding to one block (=128 [Kbyte])) specified by the supplied data erase control signal. As a result, in the erase processing applied area where the data ease processing has been applied, all memory transistors have values of "1".

Thereafter, the memory section 2 receives a read control signal, which instructs the memory section 2 to perform data read processing for the erase processing applied area, from the MCU 4 for the check of data storage state in the memory section 2. The memory section 2 accordingly starts the data read processing for the erase processing applied area.

Figure 5A:
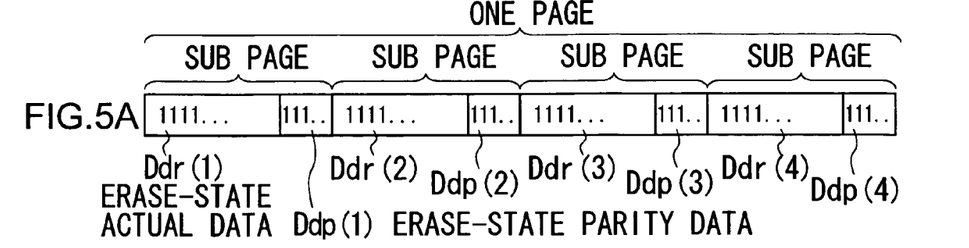
FIGS. 5A to 5G are schematic views for explaining data transition.

More specifically, in the memory section 2, data read processing and data write processing are performed in the unit of one page (for example, in the unit of 2 [Kbyte]). Accordingly, through the data read processing for the erase processing applied area, four erase-state actual data Ddr (1 to 4) each containing only "1s" and four erase-state parity data Ddp (1 to 4) each containing only "1s" values are read out as shown in FIG. 5A.

Figure 5B:
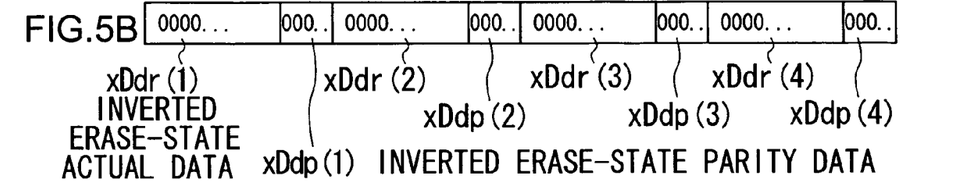

The memory section 2 then supplies the read out four erase-state actual data Ddr (1 to 4) and four erase-state parity data Ddp (1 to 4) to the third data inverting circuit 13 through the timing generator section 8. At this time, the third data inverting circuit 13 applies the bit inversion to the supplied four erase-state actual data Ddr (1 to 4) and four erase-state parity data Ddp (1 to 4) to generate four inverted erase-state actual data xDdr (1 to 4) each containing only "0s" and four inverted erase-state parity data xDdp (1 to 4) each containing only "0s" as shown in FIG. 5B and supplies them to the decoder circuit 7B of the ECC section 7.

Then the decoder circuit 7B of the ECC section 7 receives the four inverted erase-state actual data xDdr (1 to 4) and four inverted erase-state parity data xDdp (1 to 4) from the third data inverting circuit 13 and performs error detection/correction processing for the received inverted erase-state actual data xDdr (1 to 4) based on the corresponding inverted erase-state parity data xDdp (1 to 4).

Figure 6A:
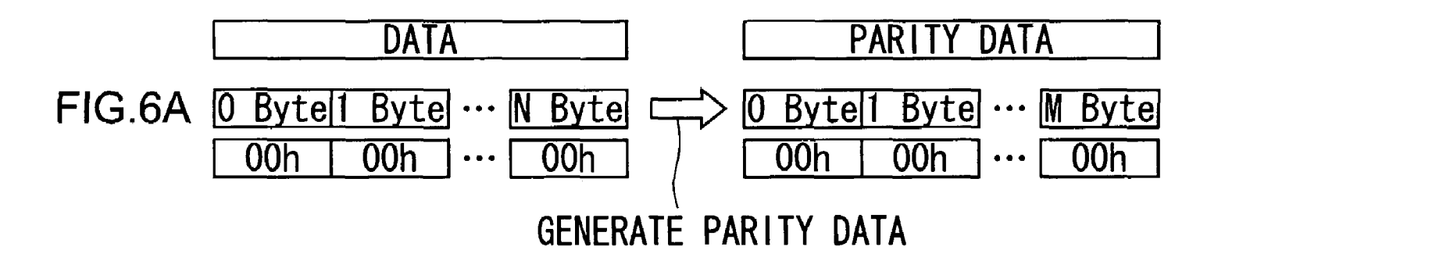
FIGS. 6A and 6B are schematic views for explaining parity data creation and error detection processing.
Figure 6B:
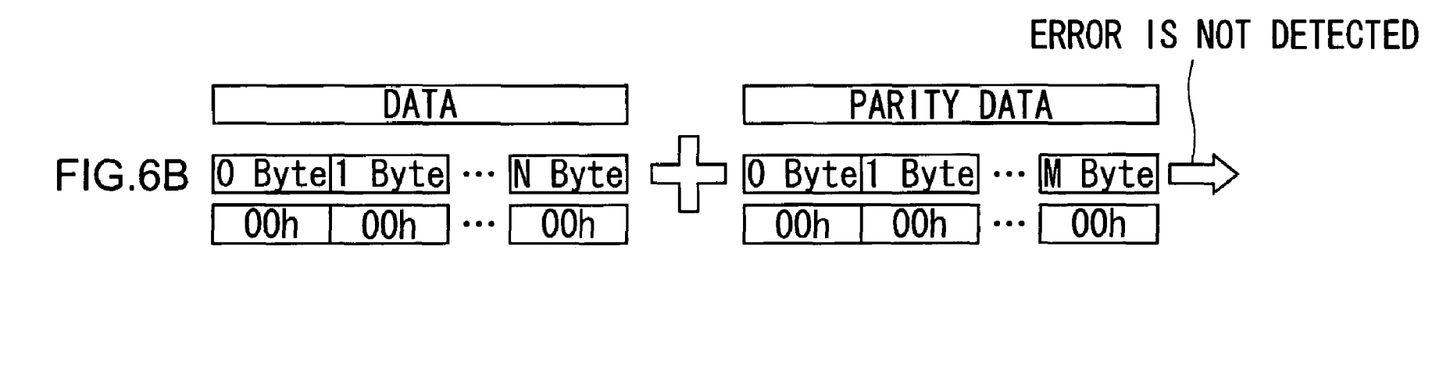

The ECC section 7 adopting the BCH coding generates parity data containing only "0s" for the data containing only "0s" as shown in FIG. 6A. Therefore, when the error detection processing is performed for the data containing only "0s" on the parity data containing only "0s" as shown in FIG. 6B, it is determined that there is no error in this data. On the other hand, the ECC section 7 adopting the BCH coding does not generate parity data containing only "1s" for the data containing only "1s". Therefore, when the error detection processing is performed for the data containing only "1s" on the parity data containing only "1s", it is determined that there is an error in this data.

Therefore, in this case, the decoder circuit 7B of the ECC section 7 performs the error detection processing for the inverted erase-state actual data xDdr (1 to 4) each containing only "0s" based on the corresponding inverted erase-state parity data xDdp (1 to 4) each containing only "0s", so that it is determined that there is no error in the inverted erase-state actual data xDdr (1 to 4).

Figure 5C:
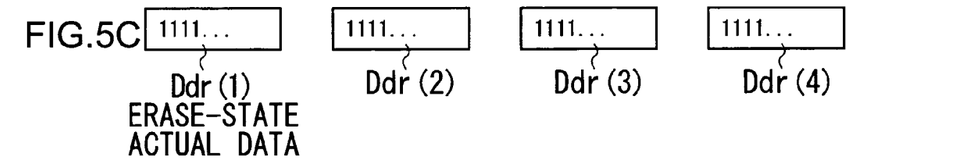
Figure 5D:
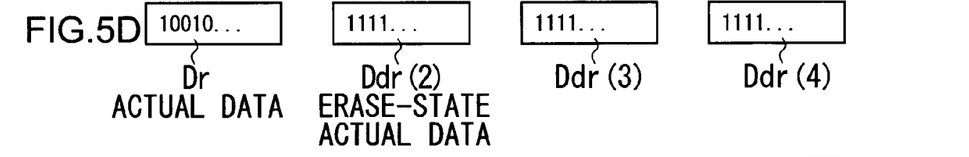

The decoder circuit 7B of the ECC section 7 supplies the inverted erase-state actual data xDdr (1 to 4) to the fourth data inverting circuit 14 without applying error correction processing thereto. At this time, the fourth data inverting circuit 14 bit-inverts the inverted erase-state actual data xDdr (1 to 4) supplied from the decoder circuit 7B to generate erase-state actual data Ddr (1 to 4) each containing only "1s" as shown in FIG. 5C and supplies them to the information processing device through the page buffer section 6 and host interface section 5. In this manner, the information processing device can normally receive the erase-state actual data Ddr (1 to 4) each containing only "1s".

Next, a case where the information processing device updates one erase-state actual data Ddr (1) of the read out erase-state actual data Ddr (1 to 4) corresponding to one page and writes back one actual data Dr and three erase-state actual data Ddr (2 to 4) as a one page into the memory section 2 of the semiconductor storage device 1.

Figure 5E:
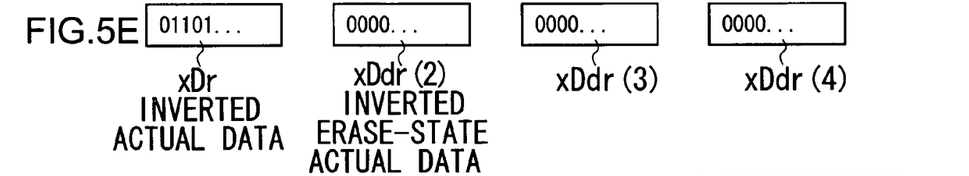

The first data inverting circuit 11 receives, from the information processing device through the host interface section 5 and page buffer section 6, one actual data Dr containing, for example, "0s" and "1s" and three erase-state actual data Ddr (2 to 4) each containing only "1s" as data corresponding to one page to be written back into the memory section 2. Then the first data inverting circuit 11 applies bit inversion to the received actual data Dr to generate inverted actual data xDr as shown in FIG. 5E, and further applies bit inversion to the received three erase-state actual data Ddr (2 to 4) to generate three inverted erase-state actual data xDdr (2 to 4) each containing only "0s" and supplies the generated inverted actual data xDr and three inverted erase-state actual data xDdr (2 to 4) to the encoder circuit 7A of the ECC section 7.

Figure 5F:
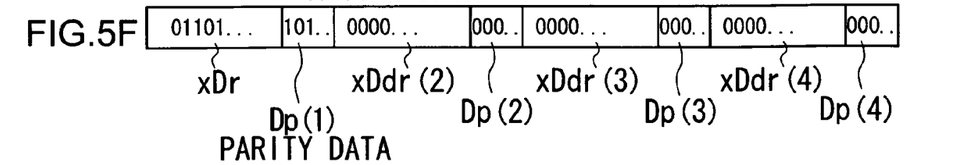

At this time, the encoder circuit 7A of the ECC section 7 generates parity data Dp (1) corresponding to the inverted actual data xDr supplied from the first data inverting circuit 11 as shown in FIG. 5F and supplies the inverted actual data xDr and parity data Dp (1) to the second data inverting circuit 12. Further, at this time, the encoder circuit 7A of the ECC section 7 generates parity data Dp (2 to 4) containing only "0s" as parity data corresponding to the inverted erase-state actual data xDdr (2 to 4) supplied from the first data inverting circuit 11 and supplies the inverted erase-state actual data xDdr (2 to 4) and the generated parity data Dp (2 to 4) to the second data inverting circuit 12.

The second data inverting circuit 12 applies bit inversion to the inverted actual data xDr supplied from the encoder circuit 7A and the parity data Dp (1) corresponding to the inverted actual data xDr to generate actual data Dr and inverted parity data xDp (1) (FIG. 5G) and supplies them to the memory section 2 through the timing generator section 8.

Figure 5G:
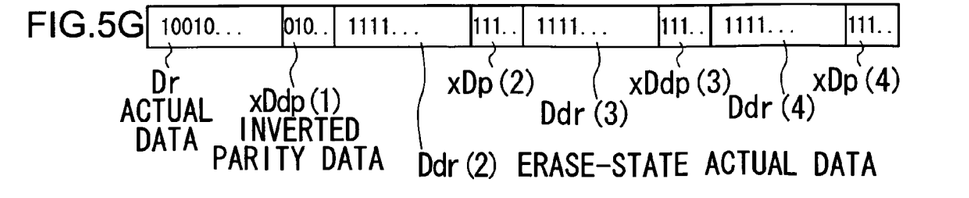

Further, at this time, the second data inverting circuit 12 applies bit inversion to the inverted erase-state actual data xDdr (2 to 4) supplied from the encoder circuit 7A and the parity data Dp (2 to 4) corresponding respectively to the inverted erase-state actual data xDdr (2 to 4) to generate, for example, as shown in FIG. 5G, erase-state actual data Ddr (2 to 4) containing only "1s" and inverted parity data xDp (2 to 4) containing only "1s" and supplies them to the memory section 2 through the timing generator section 8.

In this manner, the memory section 2 stores the actual data Dr and inverted parity data xDp (1) corresponding to the actual data Dr supplied from the second data inverting circuit 12 in the corresponding area in the erase processing applied area and, at the same time, stores the three erase-state actual data Ddr (2 to 4) each containing only "1s" and three inverted parity data xDp (2 to 4) each containing only "1s" in the erase processing applied area.

As a result, in the erase processing applied area, it is possible for all the portion (hereinafter, referred to as "erase-state maintenance area") other than the portion in which the actual data Dr is stored through the update processing of the information processing device, that is, all the portion required to maintain a state where the data has been erased to keep holding "1".

Assume that the first data inverting circuit 11 does not exist between the page buffer section 6 and encoder circuit 7A of the ECC section 7 and that the second data inverting circuit 12 does not exist between the encoder circuit 7A of the ECC section 7 and timing generator section 8. In this case, when the erase-state actual data Ddr (2 to 4) only containing "1s" are supplied from the information processing device to encoder circuit 7A for the purpose of being written back into the memory section 2, the encoder circuit 7A generates parity data containing "0" as parity data corresponding to the erase-state actual data Ddr (2 to 4). As a result, in the erase processing applied area in the memory section 2, "0" is written also in the portion other than that the actual data Dr is stored in this time through the update processing of the information processing device, that is, the erase-state maintenance portion. In the case where "0" is written in the erase-state maintenance portion that is required to maintain a state where the data has been erased as describe above, when some actual data is written in this erase-state maintenance portion from then on, it will be more likely that the actual data cannot be correctly written in the memory section 2. However, in the embodiment of the present invention, all the erase-state maintenance portions can hold "1", so that it is possible to prevent the above problem.

(3) Operation and Effect

As described above, in the semiconductor storage device 1, when data read processing is performed for the erase-processing applied area in the memory section 2 to read out the erase-state actual data Ddr and erase-state parity data Ddp each containing only "1s", the erase-state actual data Ddr and erase-state parity data Ddp are bit inverted by the third data inverting circuit 13 to make all the values thereof "0", followed by execution of the error detection processing. With the above configuration, it is possible to prevent an error from being detected in the error detection processing.

Further, in the semiconductor storage device 1, the inverted erase-state actual data xDdr whose all values become "0" after being subjected to the error detection processing can be output after all the values thereof are made "1" by the data inversion performed by the fourth data inverting circuit 14. Thus, it is possible to allow the information processing device side that processes the output data (erase-state actual data Ddr) to reliably recognize that the output data is the one that has been read out from the erase processing applied area.

In the above configuration, data read processing is performed for the erase processing applied area in the memory section 22. Thus, even when the erase-state actual data Ddr and erase-state parity data Ddp each containing only "1s" are read, it is possible to prevent an error from being detected in the error detection processing for the erase-state actual data Ddr and erase-state parity data Ddp. As a result, a semiconductor storage device 1 capable of normally reading out data from the erase processing applied area can be realized.

(4) Other Embodiment

Although a BCH coding is used as the error detection/correction system in the ECC section 7 in the above embodiment, the present invention is not limited this. For example, it is possible to use a Read Solomon coding.

Although the present invention is applied to the semiconductor storage device 1 having a NAND-type flash memory in the above embodiment, the present invention is not limited to this. For example, the present invention is also applicable to various types of semiconductor memories or storage media as far as all the data values in the erase processing applied area become "1".

The present invention is applicable to a semiconductor storage device and the like having a flash memory.

It should be understood by those skilled in the art that various modifications, combinations, sub-combinations and alternations may occur depending on design requirements and other factors insofar as they are within the scope of the appended claims or the equivalents thereof.

What is claimed is:

1. A storage device having storage means for storing data and error detection data for detecting an error in the data, and error detection means for performing error detection processing for detecting whether there is an error in readout data based on the error detection data corresponding to the data read out from the storage means, comprising first data inverting means for inverting the data read out from the storage means and inverting the error detection data read out from the storage means corresponding to the data and outputting the inverted data and inverted error detection data to the error detection means to perform error detection processing.

2. The storage device according to claim 1, comprising second data inverting means for inverting the inverted data that has been subjected to the error detection processing by the error detection means and then outputting the doubly inverted data.

3. The storage device according to claim 1, having error detection data generation means for generating the error detection data corresponding to the data to be stored in the storage means, and further comprising:

third data inverting means for inverting the data to be stored in the storage means and allowing the error detection data generation means to generate the error detection data corresponding to the data after the data inversion; and fourth data inverting means for inverting the data inverted by the third data inverting means and the error detection data which is generated so as to correspond to the data and allowing the storage means to store them after the data inversion.

4. The storage device according to claim 1, wherein the error detection means utilizes a parity generation algorithm that generates parity data that does not contain all 1's when data upon which the parity bits are generated are all 1's.

5. The storage device according to claim 4, wherein the parity generation algorithm is based on BCH codes.

6. The storage device according to claim 4, wherein the parity generation algorithm is based on reed-solomon codes.

7. The storage device according to claim 1, wherein the storage means is a NAND-type flash memory.

8. The storage device according to claim 1, wherein the storage means comprises floating gate transistors.

9. A storage device having a storage unit that stores data and error detection data for detecting an error in the data, and an error detection unit that performs error detection processing for detecting whether there is an error in readout data based on the error detection data corresponding to the data read out from the storage unit, comprising a first data inverting unit that inverts the data read out from the storage unit and inverting the error detection data corresponding to the data and outputting the inverted data and inverted error detection data to the error detection unit to perform error detection processing.

10. The storage device according to claim 9, wherein the error detection unit utilizes a parity generation algorithm that generates parity data that does not contain all 1's when data upon which the parity bits are generated are all 1's.

11. The storage device according to claim 10, wherein the parity generation algorithm is based on BCH codes.

12. The storage device according to claim 10, wherein the parity generation algorithm is based on reed-solomon codes.

13. The storage device according to claim 9, wherein the storage unit is a NAND-type flash memory.

14. The storage device according to claim 9, wherein the storage unit comprises floating gate transistors.

* * * * *